(12) United States Patent
Huang et al.

(10) Patent No.: US 9,257,323 B2
(45) Date of Patent: Feb. 9, 2016

(54) SEMICONDUCTOR DEVICE AND METHOD FOR FORMING THE SAME

(71) Applicant: Taiwan Semiconductor Manufacturing Company, Ltd., Hsin-Chu (TW)

(72) Inventors: Yu-Lien Huang, Jhubei (TW); Tung Ying Lee, Hsin-Chu (TW); Pei-Yi Lin, Taichung (TW); Chun-Hsiang Fan, Longtan Township (TW); Sheng-Wen Yu, New Taipei (TW); Neng-Kuo Chen, Sinshih Township (TW); Ming-Huan Tsai, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/894,605

(22) Filed: May 15, 2013

(65) Prior Publication Data

US 2014/0252432 A1    Sep. 11, 2014

Related U.S. Application Data

(60) Provisional application No. 61/776,518, filed on Mar. 11, 2013.

(51) Int. Cl.
*H01L 21/70* (2006.01)
*H01L 21/762* (2006.01)

(52) U.S. Cl.
CPC .... *H01L 21/76224* (2013.01); *H01L 21/76229* (2013.01)

(58) Field of Classification Search
USPC .......... 257/374, 93, 446, 499, 506, 524, 288, 257/E21.545, E21.546, E21.548, E21.55
See application file for complete search history.

(56) References Cited

U.S. PATENT DOCUMENTS

| | | | |
|---|---|---|---|
| 6,150,238 A | 11/2000 | Wu et al. | |
| 6,255,194 B1 | 7/2001 | Hong | |
| 6,875,670 B2 | 4/2005 | Lee et al. | |
| 7,001,823 B1 | 2/2006 | Gopinath et al. | |
| 7,619,294 B1 * | 11/2009 | Gopinath et al. | 257/510 |
| 7,968,425 B2 | 6/2011 | Bian et al. | |
| 8,017,496 B2 * | 9/2011 | Kim et al. | 438/437 |
| 8,383,490 B2 * | 2/2013 | Fan et al. | 438/424 |
| 2005/0054176 A1 | 3/2005 | Jung | |
| 2005/0153519 A1 | 7/2005 | Lu et al. | |
| 2006/0110892 A1 | 5/2006 | Orlowski et al. | |
| 2008/0132016 A1 * | 6/2008 | Lee | 438/264 |
| 2008/0132030 A1 | 6/2008 | Yoon et al. | |
| 2009/0035917 A1 | 2/2009 | Ahn et al. | |
| 2010/0193898 A1 | 8/2010 | Hautala et al. | |
| 2014/0038413 A1 | 2/2014 | Schmidt et al. | |
| 2014/0256113 A1 | 9/2014 | Huang | |

FOREIGN PATENT DOCUMENTS

CN       101630655 A    1/2010
TW          531832 B    5/2003

* cited by examiner

*Primary Examiner* — Timor Karimy
(74) *Attorney, Agent, or Firm* — Slater & Matsil, L.L.P.

(57) ABSTRACT

A semiconductor device includes a substrate and a gate structure formed over the substrate. The semiconductor device further includes an insulator feature formed in the substrate. The insulator feature includes an insulating layer and a capping layer over the insulating layer.

19 Claims, 10 Drawing Sheets

US 9,257,323 B2

SEMICONDUCTOR DEVICE AND METHOD FOR FORMING THE SAME

This application claims the benefit of U.S. Provisional Application No. 61/776,518, filed Mar. 11, 2013 entitled "Semiconductor Device and Method for Forming the Same," which application is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, an advanced process for forming trench isolation structure, such as a shallow trench isolation (STI) structure, is required because the trench isolation structure may be attacked by subsequent wet cleaning processes. The wet cleaning processes may, therefore, result a different step heights of trench isolation structures within dense areas and isolation areas and increase the process complexity. In addition, the wet cleaning processes may result in divots in trench isolation structures and induce gate leakage current.

Although existing approaches to forming trench isolation structures for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DETAILED DESCRIPTION OF ILLUSTRATIVE EMBODIMENTS

Figure 1:
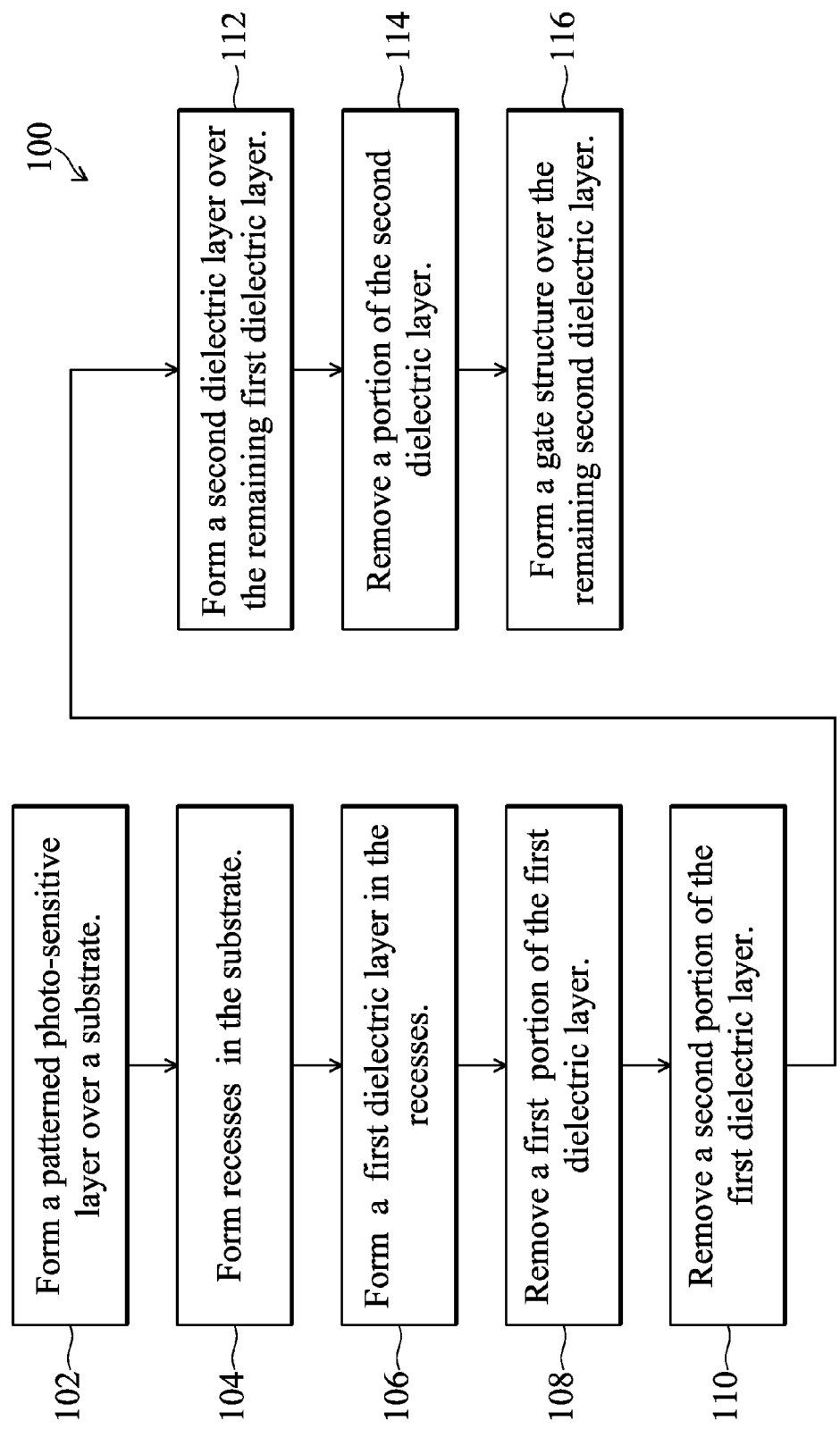
FIG. 1 is a flowchart illustrating a method for fabricating a semiconductor device according to various aspects in one or more embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device 200 (a transistor) according to various aspects in one or more embodiments. FIGS. 2-10 show schematic cross-sectional views of a semiconductor device 200 at various stages of fabrication according to one or more embodiments of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
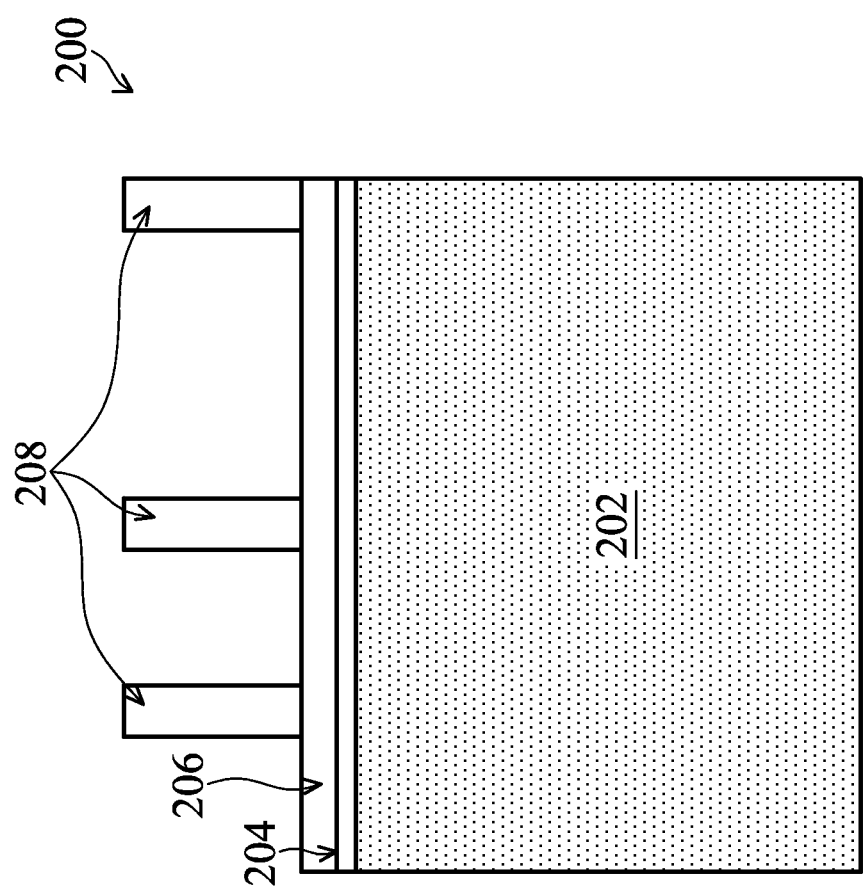
FIGS. 2-10 show schematic cross-sectional views of a semiconductor device at various stages of fabrication according to various aspects in one or more embodiments.

Referring to FIGS. 1 and 2, the method 100 begins at step 102 wherein a patterned photo-sensitive layer 208 is formed over a substrate 202. In some embodiments, the substrate 202 comprises a bulk substrate such as a crystalline silicon substrate (e.g., Si wafer). In alternative embodiments, the substrate 202 includes a top semiconductor layer of a compound wafer, such as a silicon-on-insulator substrate. In yet other embodiments, the substrate 202 is a bulk substrate or a top layer of a compound wafer comprising Ge, SiGe, a III-V material such as GaAs, InAs, a II-VI material such as ZeSe, ZnS, and the like, typically epitaxially grown. It is believed the III-V or II-VI materials may be particularly advantageous for forming illustrative devices because of the beneficial strain properties that can be derived from using III-V or II-VI properties, such as InAs, ZnS, and the like.

In some embodiments, prior to forming the patterned photo-sensitive layer 208, a pad layer 204 is formed over the substrate 202 and a hard mask layer 206 is formed over the pad layer 204. In some embodiments, the pad layer 204 includes an oxide layer, e.g., silicon oxide. In some embodiments, the hard mask layer 206 is a nitrogen-containing layer, such as silicon nitride, silicon oxynitride, or the like. In some embodiments, the pad layer 204 and the hard mask layer 206 are formed using a chemical vapor deposition (CVD) process, furnace process, or the like. In some embodiments, the patterned photo-sensitive layer 208 comprises photoresist patterns or the like. The patterning process for forming the patterned photo-sensitive layer 208 includes, for example, forming a photo-sensitive layer over the hard mask layer 206, exposing the photo-sensitive layer to a radiation source, and then developing the exposed photo-sensitive layer in a developer solution.

Figure 3:
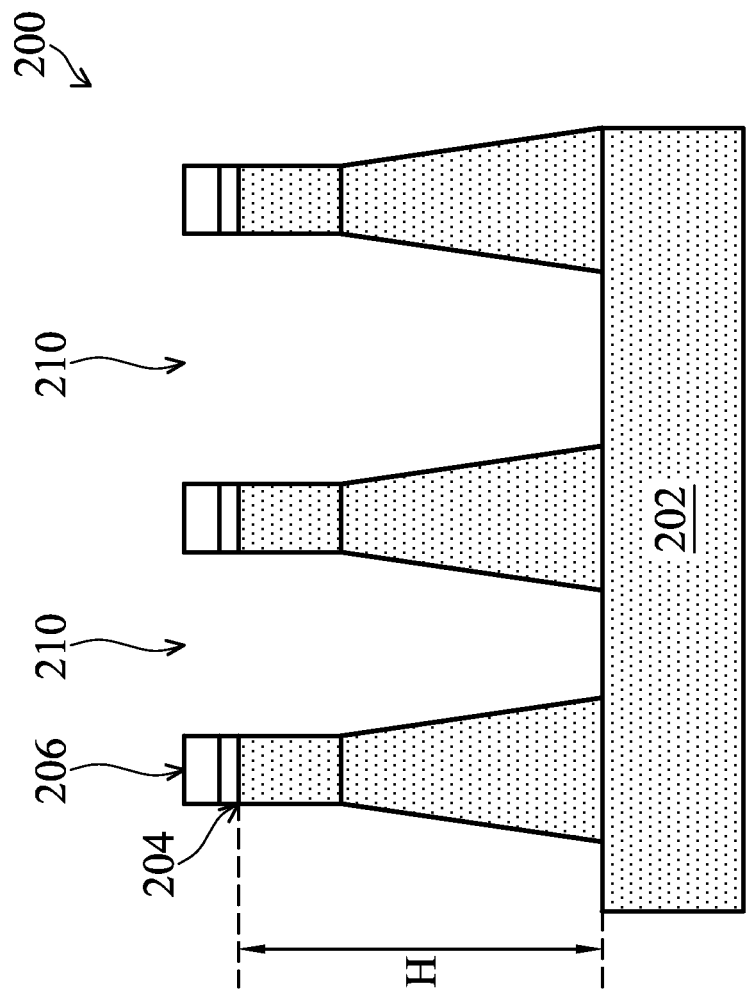

Referring to FIGS. 1 and 3, the method 100 proceeds to step 104 in which recesses 210 are formed in the substrate 202. In some embodiments, the recesses 210 are preserved for forming insulators in the substrate 202. In some embodiments, the recesses 210 are formed by applying an etching process to the substrate 202 using the patterned photo-sensitive layer 208 as a mask. In some embodiments, the patterns of patterned photo-sensitive layer 208 are transferred into the hard mask layer 206 and the pad layer 204 to form patterned hard mask layer 206 and patterned pad layer 204, respectively. Then, the patterns of patterned hard mask layer 206 and patterned pad layer 204 are transferred into the substrate 202 to form the recesses 210 by a single etching process or multiple etching processes. In some embodiments, the etching process for forming the recesses 210 is a dry etching process. In the present embodiment, the dry etching process is performed using a top coil plasma (TCP) or the like. In some embodiments, the etching process for forming the recesses 210 is a dry etching process performed using F-containing gas, Cl-containing gas, or the like. In some embodiments, the recesses 210 have a height H in the substrate 202 ranging from about 150 nm to about 350 nm.

During this pattern transferring process, in some embodiments, the patterned photo-sensitive layer 208 is entirely consumed as indicated by FIG. 3. In alternative embodiments, the patterned photo-sensitive layer 208 is not entirely consumed after this pattern transferring process. The remaining patterned photo-sensitive layer 208 is then removed by a dry and/or wet stripping process, e.g., oxygen plasma or so-called ash process, after forming the recesses 210.

Figure 4:
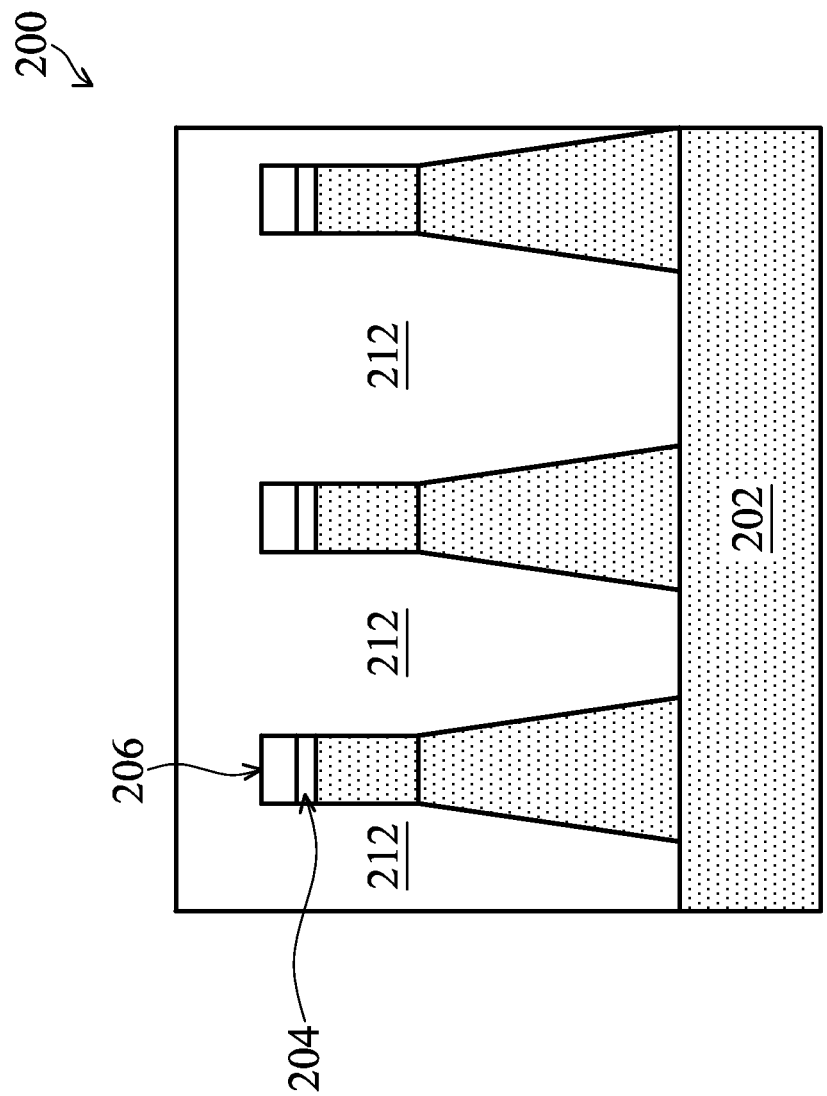

Referring to FIGS. 1 and 4, the method 100 proceeds to step 106 in which a first dielectric layer 212 is formed in the recesses 210. In some embodiments, the first dielectric layer 212 fills the recesses 210 and is over the patterned hard mask layer 206. In some embodiments, the first dielectric layer 212 includes an oxide layer such as silicon oxide. In some embodiments, the first dielectric layer 212 is referred to as shallow trench isolation oxide or just shallow trench isolation. In some embodiments, the first dielectric layer 212 is deposited by subatomic chemical vapor deposition (SACVD) process, spin-on-glass process, flow-able CVD, high density plasma (HDP), or the like. In some embodiments, prior to forming the first dielectric layer 212, a thermal oxidation is applied to repair the damage to the sidewalls of the recesses 210 that resulted from the etching step for forming the recesses 210.

After forming the first dielectric layer 212, in some embodiments, a thermal annealing process is then applied to increase the density of the first dielectric layer 212. In some embodiments, the thermal annealing process is a two-step annealing process applied for the first dielectric layer 212 formed by SACVD or flow-able CVD deposition. A first step of the two-step annealing process, for example, is performed using $H_2$ and $O_2$ for forming an $H_2O$ steam at a temperature ranging between about 100° C. and about 700° C. A second step is then applied to the first dielectric layer 212 at a temperature higher than the temperature of the first step of the two-step annealing process. For example, the second step is performed using $N_2$ at a temperature ranging between about 700° C. and about 1200° C. In alternative embodiments, the first dielectric layer 212 is formed by a HDP deposition, and the thermal annealing process is a rapid thermal annealing (RTA) performed at a temperature ranging between about 700° C. and about 1200° C.

Figure 5:
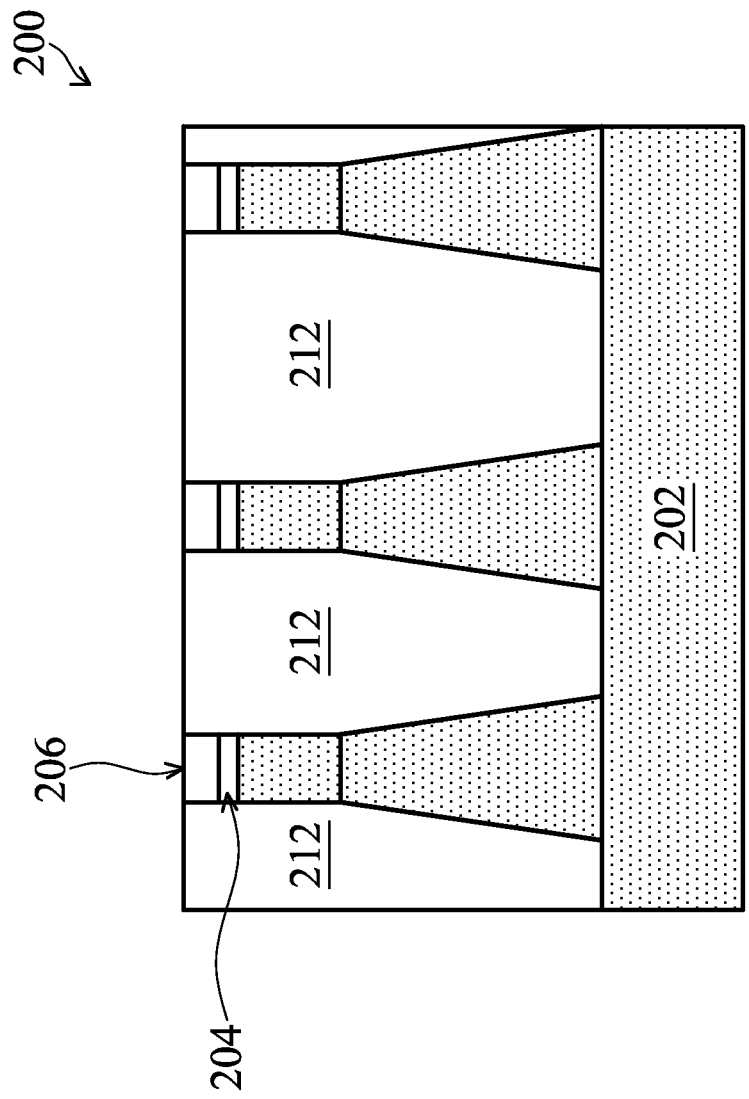

Referring to FIGS. 1 and 5, the method 100 proceeds to step 108 in which a first portion of the first dielectric layer 212 is removed. In some embodiments, the first portion of the first dielectric layer 212 is removed by a chemical mechanical polishing (CMP) process. In some embodiments, the CMP process removes the portion of the first dielectric layer 212 over the patterned hard mask layer 206, while leaving another portion of the first dielectric layer 212 with the recesses 210. In some embodiments, the CMP process is employed to thin down the first dielectric layer 212 to form a planarized first dielectric layer 212. In some embodiments, the CMP process exposes the top surface of the patterned hard mask layer 206. In some embodiments, the CMP process is performed using a slurry containing $SiO_2$, KOH, the like, or the combinations thereof. In some embodiments, the patterned hard mask layer 206 and the patterned pad layer 204 are not removed during the removing process.

Figure 6:
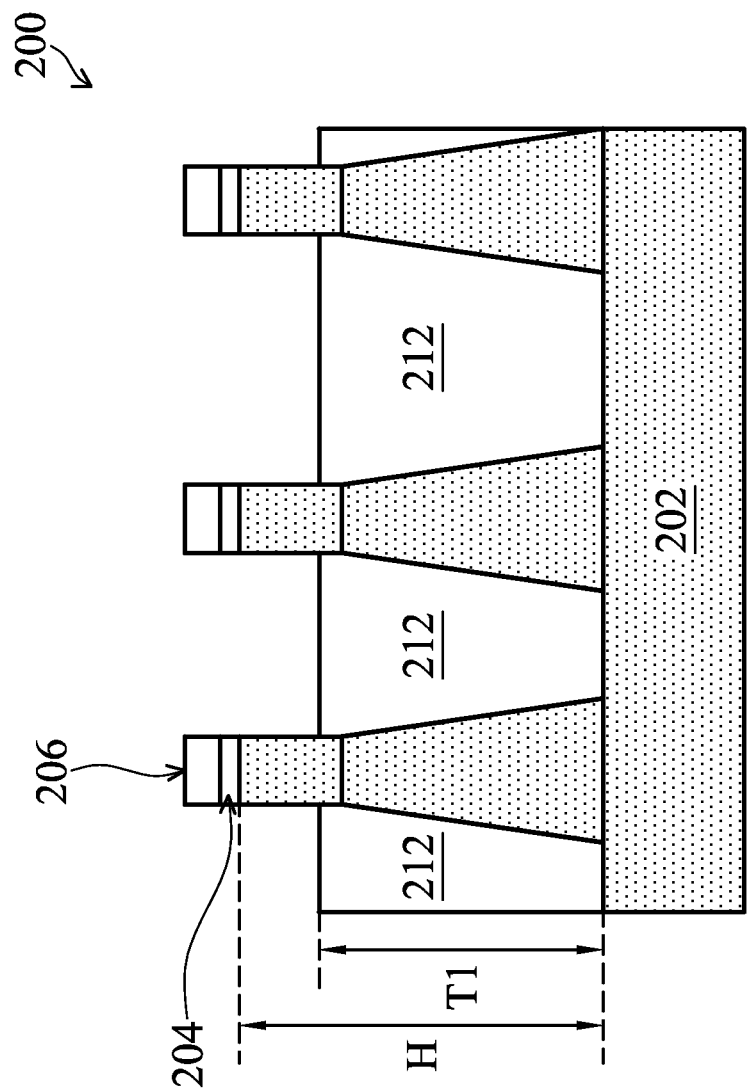

Referring to FIGS. 1 and 6, the method 100 proceeds to step 110 in which a second portion of the first dielectric layer 212 is removed. In some embodiments, the removing process does not completely remove the first dielectric layer 212 to leave a remaining portion of the first dielectric layer 212 in the recesses 210. In some embodiments, the remaining portion of the first dielectric layer 212 functions as an insulating material in the preserved insulators. In some embodiments, the remaining portion of the first dielectric layer 212 has a thickness T1 ranging from about 5 nm to about 50 nm. In some embodiments, the removing process exposes the sidewalls of the patterned hard mask layer 206 and the patterned pad layer 204. In some embodiments, the removing process exposes the upper sidewalls of the recesses 210. In some embodiments, the removing process includes an etching process. In some embodiments, the etching process is a wet etching process lasting for a designed period of time. In some embodiments, the removing process is a wet etching process performed using a diluted hydrofluoric acid (DHF) or a chemical oxide removal (COR).

Figure 7:
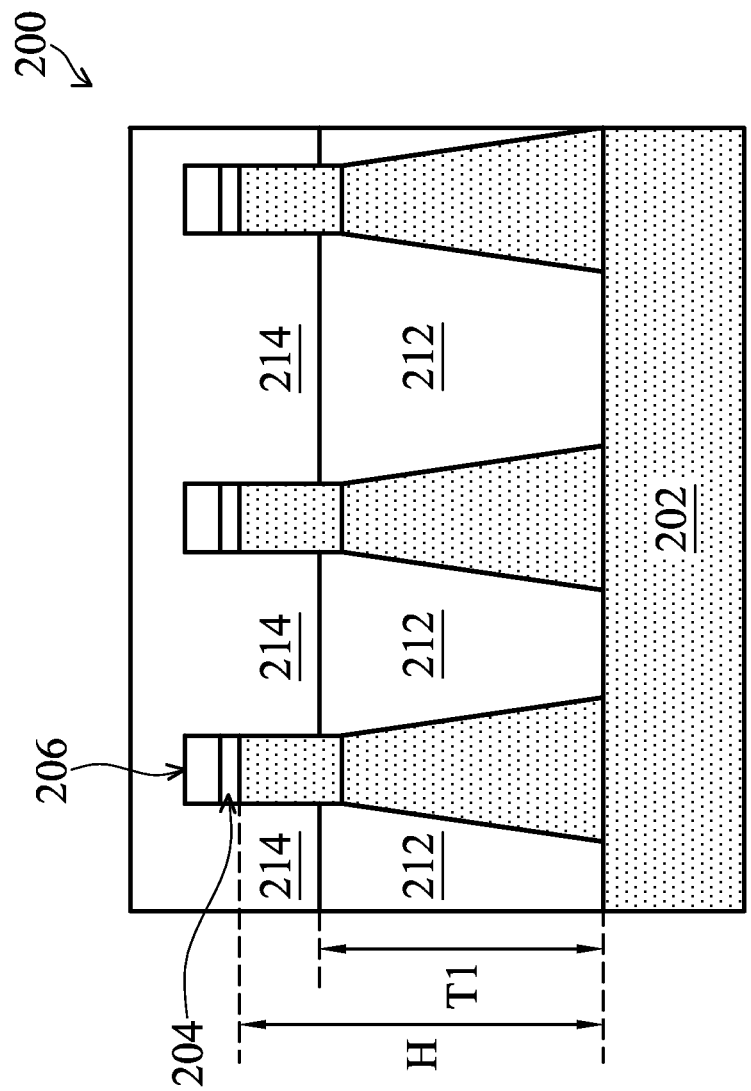

Referring to FIGS. 1 and 7, the method 100 proceeds to step 112 in which a second dielectric layer 214 is formed over the remaining first dielectric layer 212. In some embodiments, the second dielectric layer 214 has a top surface higher than the top surface of the patterned hard mask layer 206. In some embodiments, the second dielectric layer 214 includes a material different from the first dielectric layer 212. In some embodiments, the second dielectric layer 214 includes a material different from the patterned hard mask layer 206 or the patterned pad layer 204. In some embodiments, the second dielectric layer 214 includes a nitride layer or carbide layer. In some embodiments, the second dielectric layer 214 is SiN, SiCN, SiON, SiC, Si-rich oxide, or combinations thereof. In some embodiments, the second dielectric layer 214 has a dielectric constant (k) higher than the dielectric constant of the first dielectric layer 212. In some embodiments, the second dielectric layer 214 is deposited by CVD, spin-on-glass process, flow-able CVD, atomic layer deposition (ALD), molecular layer deposition (MLD), furnace, or the like.

In some embodiments, the second dielectric layer 214 functions as a capping layer for protecting the underlying remaining first dielectric layer 212 from being damaged in a subsequent wet etching and/or cleaning process. In some embodiments, the second dielectric layer 214 has an etching resistance higher than the first dielectric layer 212 during a subsequent etching process. Therefore, the second dielectric layer 214 has an etching rate lower than an etching rate of the first dielectric layer 212 in the subsequent etching process. In some embodiments, the subsequent etching process is a wet etching process performed using a DHF solution. In some embodiments, a ratio of an etching rate of the second dielectric layer 214 to an etching rate of the first dielectric layer 212, in a DHF solution, is less than about 1:2. In the present embodiment, in a DHF solution, a ratio of an etching rate of the second dielectric layer 214 to an etching rate of the first dielectric layer 212 is less than about 1:100.

Figure 8:
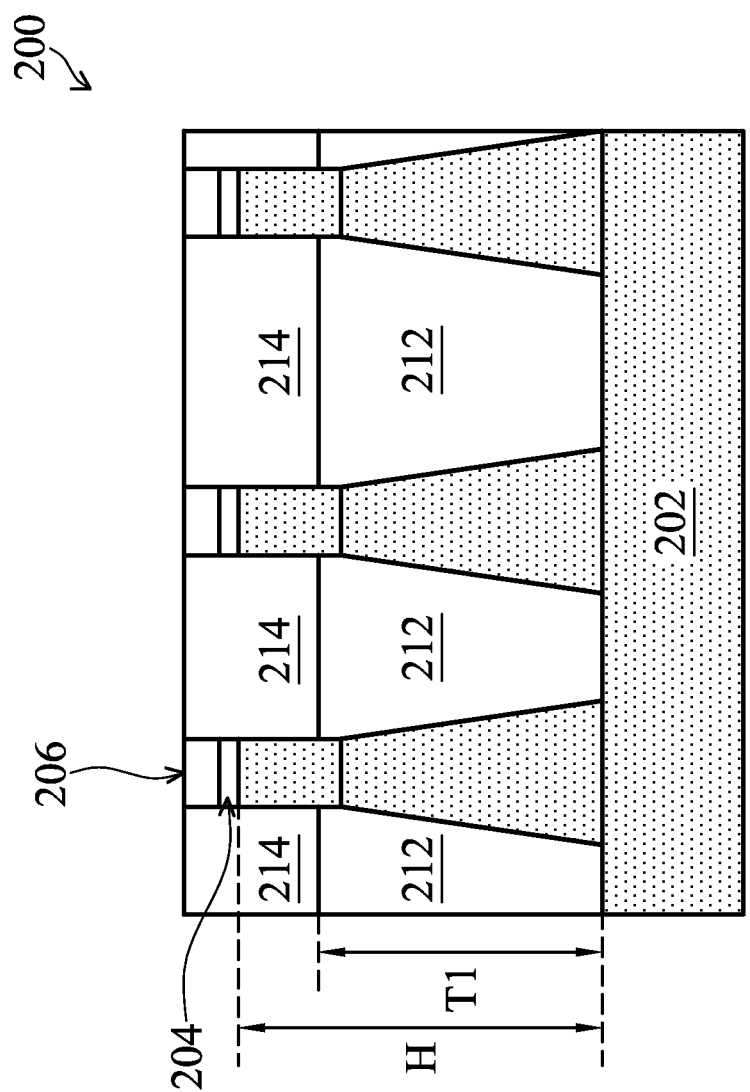

Referring to FIGS. 1 and 8, the method 100 proceeds to step 114 in which a portion of the second dielectric layer 214 is removed by a removing process. In some embodiments, the portion of the second dielectric layer 214 over the patterned pad layer 204 is removed in the removing process. In some embodiments, the removing process includes a CMP step. In some embodiments, the CMP step planarizes and thins down the second dielectric layer 214. In some embodiments, the CMP step does not remove the patterned hard mask layer 206. In some embodiments, the CMP step exposes the top surface of the patterned hard mask layer 206. In some embodiments, the CMP step is performed using a slurry containing $SiO_2$, KOH, the like, or the combinations thereof.

Figure 9:
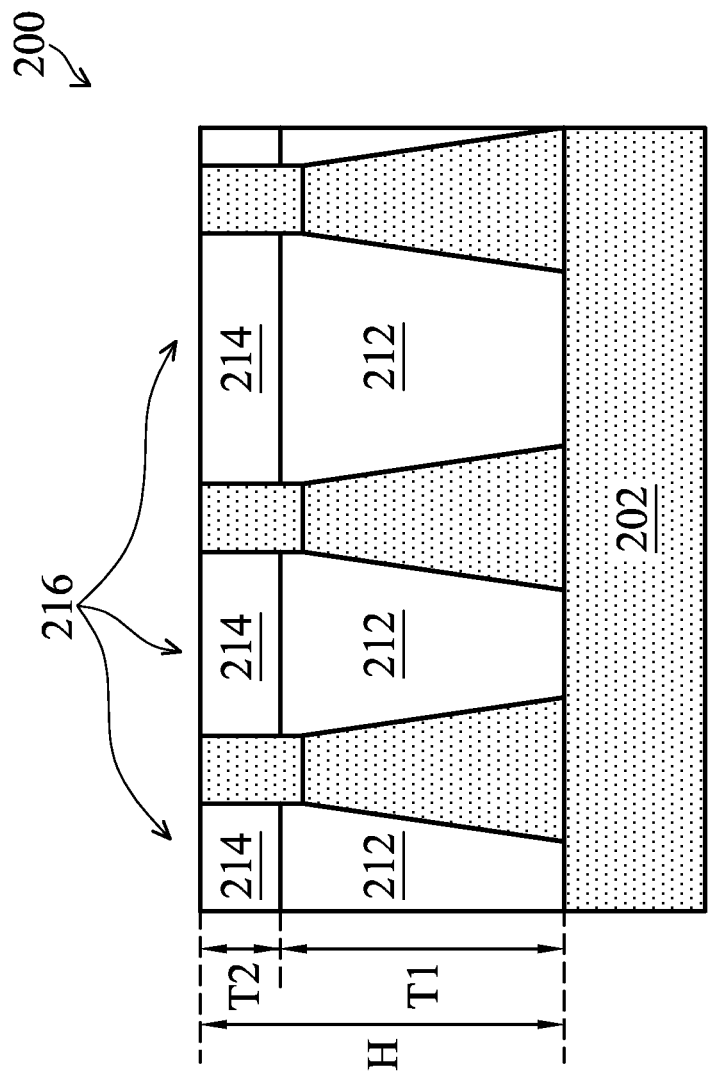

Referring to FIG. 9, the patterned hard mask layer 206 and the patterned pad layer 204 are removed. In some embodiments, the patterned hard mask layer 206 is removed after removing the portion of the second dielectric layer 214. In some embodiments, the patterned hard mask layer 206 is removed by a wet etching process. In some embodiments, the wet etching process is performed using a phosphoric acid solution at a temperature ranging from about 100° C. to about 200° C. In some embodiments, the patterned pad layer 204 is removed after removing the patterned hard mask layer 206 and a subsequent well implantation process (not shown). In some embodiments, the patterned pad layer 204 is removed by a wet etching process. In some embodiments, the wet etching process for removing the patterned pad layer 204 is performed using a dilute HF solution at about room temperature (e.g. 23° C.).

Still referring to FIG. 9, the remaining second dielectric layer 214 has a thickness T2. In some embodiments, the thickness T2 is less than the thickness T1. In some embodiments, the thickness T2 of the remaining second dielectric layer 214 is greater than about 3 nm to ensure the protection of the underlying first dielectric layer 212. In some embodiments, the thickness T2 of the remaining second dielectric layer 214 is less than about 45 nm to prevent from increasing high capacitance. In some embodiments, a ratio of the thickness T2 to the thickness T1 ranges from about 0.01 to about 0.15. In some embodiments, the combination of the remaining second dielectric layer 214 and the underlying first dielectric layer 212 form shallow trench isolation (STI) insulators 216 in the substrate 202. The STI insulators 216 may define and electrically isolate the subsequently formed various regions in the substrate 202.

Figure 10:
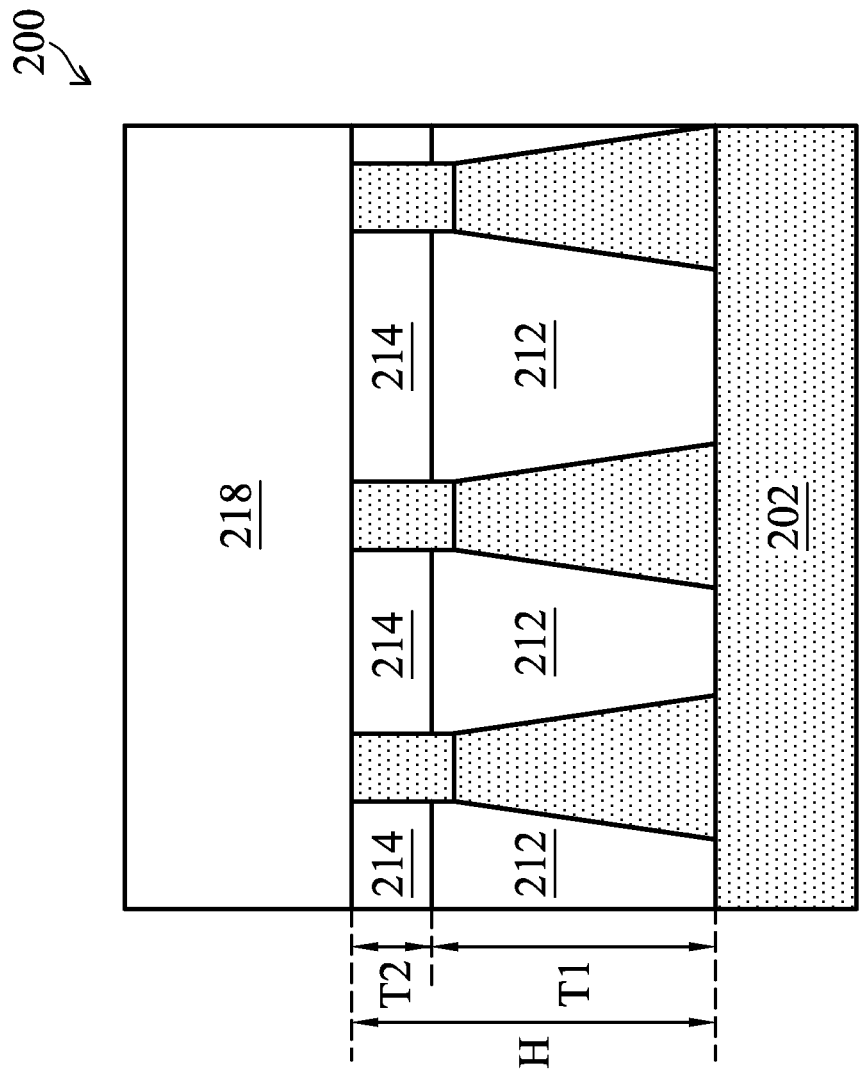

Referring to FIGS. 1 and 10, the method 100 proceeds to step 116 in which a gate structure 218 is formed over the remaining second dielectric layer 214 and the STI insulators 216. In some embodiments, the gate structure 218 comprises, in order, a gate dielectric layer a gate electrode layer, and a hard mask layer. In some embodiments, the gate structure 218 is formed by sequentially depositing and patterning the gate dielectric layer, the gate electrode layer, and the hard mask layer. The gate dielectric layer, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer is a high-k dielectric layer with a thickness in the range of about 10 angstroms to about 30 angstroms. The gate dielectric layer may be formed using a suitable process such as atomic layer deposition (ALD), chemical vapor deposition (CVD), physical vapor deposition (PVD), thermal oxidation, UV-ozone oxidation, or combinations thereof.

The gate electrode layer is then formed on the gate dielectric layer. In some embodiments, the gate electrode layer comprises a polysilicon layer. Further, the gate electrode layer may be doped polysilicon with the same or different doping species. In one embodiment, the gate electrode layer has a thickness in the range of about 30 nm to about 80 nm. The gate electrode layer may be formed using a process such as low-pressure chemical vapor deposition (LPCVD), plasma enhanced chemical vapor deposition (PECVD), other suitable processes, or combinations thereof. Next, the hard mask layer is formed over the gate electrode layer and a patterned photo-sensitive layer is formed on the hard mask layer. The pattern of the photo-sensitive layer is transferred to the hard mask layer and then transferred to the gate electrode layer and the gate dielectric layer to form the gate structure 218. In some embodiments, the hard mask layer includes silicon oxide. In alternative embodiments, the hard mask layer includes silicon nitride, silicon oxynitride, and/or other suitable dielectric materials, and may be formed using a method such as CVD or furnace. The hard mask layer has a thickness in the range from about 100 angstroms to about 1500 angstroms. The photo-sensitive layer is removed thereafter by a dry and/or wet stripping process.

A benefit of the dislocations for the STI insulators in semiconductor device, in accordance with the disclosed embodiments, is that the insulating material can be free of divots or seams by adopting a capping layer thereon to protect the insulating material from being damaged by wet processes. Thus, electrical current leakage issue can be improved. Moreover, a step height issue can be reduced because the wet etch rate of second dielectric layer 214 is much less than first dielectric layer 212, therefore the gate profile is improved to decrease gate to gate leakage.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a semiconductor device includes a substrate, a gate structure over the substrate, and an insulator feature in the substrate. The insulator feature includes an insulating layer having a first thickness and a capping layer having a second thickness over the insulating layer.

In another embodiment, a semiconductor device includes a substrate, a gate structure over the substrate, a recess in the substrate, a first dielectric layer formed in the recess, and a second dielectric layer formed over the first dielectric layer in the recess. The second dielectric layer includes a material different from a material of the first dielectric layer.

In still another embodiment, a method of forming a device, includes forming a recess in a substrate, filling a dielectric layer in the recess, removing a top portion of the dielectric layer while leaving a bottom portion of the dielectric layer in the recess, forming a capping layer over the bottom portion of the dielectric layer, and forming a gate structure over the capping layer.

What is claimed is:

1. A semiconductor device, comprising:
   a substrate;
   a transistor comprising a gate structure over the substrate; and
   an insulator feature in the substrate, wherein the insulator feature comprises:
      an insulating layer having a first thickness; and
      a capping layer, having a second thickness different from the first thickness, over the insulating layer, wherein a bottom surface of the gate structure contacts a top surface of the capping layer, and wherein a sidewall of the insulator feature comprises:
         a first portion disposed at a first angle; and
         a second portion over and connected to the first portion and disposed at a second angle, wherein the first angle and the second angle are different, and wherein an interface between the insulating feature and the capping layer intersects the second portion.

2. The device of claim 1 wherein the insulating layer is silicon oxide.

3. The device of claim 1 wherein the capping layer is SiN, SiCN, SiON, SiC, Si-rich oxide, or combinations thereof.

4. The device of claim 1 wherein the first thickness ranges from about 5 nm to about 50 nm, and wherein the second thickness ranges from about 3 nm to about 45 nm.

5. The device of claim 1 wherein a ratio of the second thickness to the first thickness ranges from about 0.01:1 to about 0.15:1.

6. The device of claim 1 wherein the second thickness is less than the first thickness.

7. The device of claim 1 wherein a ratio of an etching rate of the capping layer to an etching rate of the insulating layer, in a diluted hydrofluoric acid (DHF) solution, is less than about 1:2.

8. The device of claim 1 wherein a ratio of an etching rate of the capping layer to an etching rate of the insulating layer, in a diluted hydrofluoric acid (DHF) solution, is less than about 1:100.

9. The device of claim 1, wherein the second portion is substantially perpendicular to a surface of the substrate.

10. A semiconductor device, comprising:
    a substrate;
    a patterned gate structure over the substrate;
    a recess in the substrate;
    a first dielectric layer formed in the recess and filling more than half a depth of the recess; and
    a second dielectric layer formed over the first dielectric layer in the recess, wherein the second dielectric layer comprises a material different from a material of the first dielectric layer, and wherein the patterned gate structure is disposed directly over a top surface of the second dielectric layer.

11. The device of claim 10 wherein the second dielectric layer has a dielectric constant higher than a dielectric constant of the first dielectric layer.

12. The device of claim 10 wherein the first dielectric layer is O-containing material and the second dielectric layer is N-containing material.

13. The device of claim 10 wherein the second dielectric layer has a thickness less than a thickness of the first dielectric layer.

14. The device of claim 10 wherein the patterned gate structure includes a patterned gate dielectric and a patterned gate electrode.

15. The device of claim 10 wherein a ratio of a thickness of the second dielectric layer to a thickness of the first dielectric layer ranges from about 0.01 to about 0.15.

16. A semiconductor device comprising:
    a semiconductor substrate;
    an isolation region in the semiconductor substrate, wherein the isolation region comprises:
        a first dielectric layer; and
        a second dielectric layer over the first dielectric layer, wherein an etching resistance of the second dielectric layer is greater than an etching resistance of the first dielectric layer in a diluted hydrofluoric acid (DHF) solution; and
    a transistor comprising a gate structure over the semiconductor substrate and the isolation region, wherein a bottom surface of the gate structure contacts a top surface of the second dielectric layer.

17. The semiconductor device of claim 16, wherein the second dielectric layer has a dielectric constant higher than a dielectric constant of the first dielectric layer.

18. The semiconductor device of claim 16, wherein the isolation region is disposed between two adjacent portions of the semiconductor substrate, and wherein the bottom surface of the gate structure contacts top surfaces of the two adjacent portions of the semiconductor substrate.

19. The semiconductor device of claim 16, further comprising a second isolation region in the semiconductor substrate, wherein the second isolation region comprises:
    a third dielectric layer; and
    a fourth dielectric layer over the third dielectric layer, wherein an etching resistance of the fourth dielectric layer is greater than an etching resistance of the third dielectric layer in a DHF solution, and wherein the bottom surface of the gate structure contacts a top surface of the third dielectric layer.

* * * * *